United States Patent [19]

Soethout et al.

[11] Patent Number: 5,057,826

[45] Date of Patent: Oct. 15, 1991

[54] DIGITAL TV RASTER SCAN WAVEFORM DISPLAY DEVICE WITH IMAGES OF SELECTABLE SIZE AND POSITION

[75] Inventors: Adrianus Soethout, Hoofddorp; Marinus J. G. Verdult, Eindhoven, both of Netherlands

[73] Assignee: U.S. Philips Corporation, New York, N.Y.

[21] Appl. No.: 405,489

[22] Filed: Sep. 11, 1989

[30] Foreign Application Priority Data

Sep. 22, 1988 [NL] Netherlands ............... 8802345

[51] Int. Cl.$^5$ ............................................. G09G 1/00
[52] U.S. Cl. ..................................... 340/728; 340/747; 324/121 R
[58] Field of Search ............... 340/721, 723, 728, 756, 340/724, 731, 747; 324/121 R; 358/160, 168, 183; 382/44–47

[56] References Cited

U.S. PATENT DOCUMENTS

| | | | |
|---|---|---|---|
| 3,787,666 | 1/1974 | Schumann et al. | 340/756 |
| 4,231,032 | 10/1980 | Hara et al. | 340/728 |
| 4,262,290 | 4/1981 | Vallins | 340/728 |
| 4,307,393 | 12/1981 | Hamada et al. | 340/728 |
| 4,311,977 | 1/1982 | Madni | 340/728 |
| 4,464,656 | 8/1984 | Nakamura | 340/728 |
| 4,528,585 | 7/1985 | Bolger | 358/183 |
| 4,540,938 | 9/1985 | Bruce | 324/121 R |
| 4,566,126 | 1/1986 | Miyagawa et al. | 358/183 |

Primary Examiner—Alvin E. Oberley
Assistant Examiner—Richard Hjerpe
Attorney, Agent, or Firm—Bernard Franzblau

[57] ABSTRACT

A digital picture display device in which, due to a location-dependent, determined brightness drive of pixels in a picture formed line and field-sequentially, it is possible to obtain an oscilloscopic image in the form of a waveform profile on a display screen (TV, OSC). A digital signal comparison circuit (COMP) having a first input (I1) for receiving location information in the form of an actual line number (L-act) and a second input (I2) for receiving from a line buffer circuit (W-buf) digital values of the waveform profile to be displayed. The signal comparison circuit produces a binary drive signal (BDS) at its output. The line buffer circuit (W-buf) is filled from a digital picture source (DPS) via a series arrangement of another line buffer circuit (L-buf) for storing the picture information associated with a selected line having a selectable first line number (L-sel), a multiplier or divider circuit (SCAL) for obtaining picture line strips made up of different numbers of picture lines via selectable factors (W-fac) for displaying the waveform profile on different scales, and a subtractor circuit (SUB) for moving the bottom line of the picture line display strips having the different heights by means of a selectable second line number (L-bot). The digital picture display device provides an accurate location of the movable waveform profile which can be observed on a desired scale.

20 Claims, 3 Drawing Sheets

5,057,826

DIGITAL TV RASTER SCAN WAVEFORM DISPLAY DEVICE WITH IMAGES OF SELECTABLE SIZE AND POSITION

BACKGROUND OF THE INVENTION

This invention relates to a picture display device suitable for displaying an oscilloscopic image on a display screen for displaying a picture formed line and field-sequentially. The picture is composed of pixels and a given number of picture line. The display device provides a location-dependent, determined brightness drive of the pixels during line periods and field or frame periods covering these line periods which results in the oscilloscopic image. The picture display device, therefore includes a signal comparison circuit having a first input for applying a signal which determines the location during a field or frame period, a second input for applying a signal occurring at the line frequency and having a waveform profile to be displayed oscilloscopically during the line periods, and an output supplying a brightness drive signal.

A picture display device of this type is known from European Patent Application No. 0,125,372 which corresponds to U.S. Pat. No. 4,540,938 (9/10/85). The picture display is based on the line and field-sequential structure as is used for television in its broadest sense. Examples are: broadcasting services, monitoring control of areas and spaces, X-ray or infrared picture display, display of computer-generated images, etc., with moving or still pictures in all cases. Combined with these pictures, there is the desired oscilloscopic image as a waveform profile on the screen, which is obtained by the controlled brightness drive of selected pixels. In this case the signal comparison circuit is in the form of an analog differential amplifier which supplies the brightness drive signal as an amplified, cut-off difference signal which ensures the drive after forming an absolute value, a level shift and a signal inversion. To this end the signal determining the location during the field or frame period is applied in the form of a sawtooth signal to the first input of the signal comparison circuit. It is apparent that the known picture display device operates on an analog basis, which inherently implies an inaccurate determination of the location.

SUMMARY OF THE INVENTION

It is an object of the invention to realize a picture display device of the type described, which operates on a digital basis and thus leads to an inherently more accurate determination of location. To this end a picture display device according to the invention is characterized in that the lines in the frame scan direction are enumerated in an ascending or descending sequence with respect to the said picture line number in the picture display device which operates on a digital basis. The signal to be displayed oscilloscopically is stored as digital values in a line buffer circuit after a write signal, associated with a selected line having a selectable first line number, is applied to said line buffer circuit. Outputs of the line buffer circuit at which the digitized signal to be displayed occurs are coupled to inputs of a multiplier or divider circuit (scaling circuit) operating with selectable multiplication or dividing factors. Outputs of the multiplier or divider circuit are coupled to inputs of a subtractor or adder circuit (level shift circuit), respectively, other inputs of which receive a selectable second line number for addition. Outputs of the subtractor or adder circuit are coupled to inputs of a further line buffer circuit for storing the waveform profile to be displayed oscilloscopically as a difference or sum result, respectively. Outputs of said further line buffer circuit are coupled to second inputs of the signal comparison circuit, first inputs of which are coupled to outputs of a line counting circuit for counting the lines of the line numbers ascending or descending in the frame scan direction, which outputs thereby convey an actual line number.

Besides the accurate localization, it is further achieved by the invention that upon display, the oscilloscopic image, as a waveform profile chosen via the first line number, may occur on substantially the complete display screen or on a distinct part thereof in the form of a more or less narrow strip in the line direction. The lower side of the image or strip is fixed by the selected second line number and the upper side of the image or strip is fixed by the selected multiplication or dividing factor. Thus, the height of the displayed waveform can be changed and its vertical position can also be changed.

An embodiment of the device according to the invention is characterized in that the product of the number of possible digital values of the digital signal to be displayed and the largest multiplication factor of the selectable factors is smaller than or equal to the picture line number. As a result, the oscilloscopic image can be displayed with a maximum amplitude across approximately the entire height of the display screen.

Another embodiment is characterized in that the factors are selectable from a group of integral powers of the factor 2. In this case the factor 2 or an integral power thereof may be obtained in a simple, binary manner.

A first embodiment, in which the oscilloscopic image is a maximally possible continuous waveform profile, is characterized in that the signal comparison circuit comprises a signal comparator of the type having three outputs for supplying a comparison result with the respective functions of larger than, equal to and smaller than, said three outputs being coupled to the output of the signal comparison circuit via an interpolation circuit.

A further embodiment is characterized in that the interpolation circuit comprises integrated circuits operating in accordance with transistor-transistor logics, the interpolation for generating the brightness drive signal being effected in accordance with the following logic function:

$$[[[W<A]+[W=A]]\cdot[D>A]]+[[[W>A]+[W=A]]\cdot[D<A]]+[[W=A]\cdot[D=A]],$$

in which the digital value W is the instantaneous value which is supplied by the further line buffer circuit, the digital value D is equal to the previous value preceding the value W and the digital value A is the actual line number originating from the line counting circuit.

A second embodiment is characterized in that the signal comparison circuit comprises a signal comparator of the type having two outputs for supplying a comparison result with the respective functions of larger than and smaller than, said two outputs being coupled to the output of the signal comparison circuit via an interpolation circuit which comprises a programmable series logics device.

A further embodiment is characterized in that the interpolation for generating the brightness drive signal is effected in accordance with the following logic function:

$$[[W<A].[D>A]] + [[W>A].[D<A]] + [-[W<A].[W>A]]$$

in which the digital value W is the instantaneous value supplied by the further line buffer circuit, the digital value D is equal to the previous value preceding the value W, and the digital value A is the actual line number originating from the line counting circuit.

BRIEF DESCRIPTION OF THE DRAWINGS

Embodiments of the invention will now be described in greater detail, by way of example, with reference to the accompanying diagrammatic drawings, in which.

DESCRIPTION OF THE PREFERRED EMBODIMENTS

Figure 1:
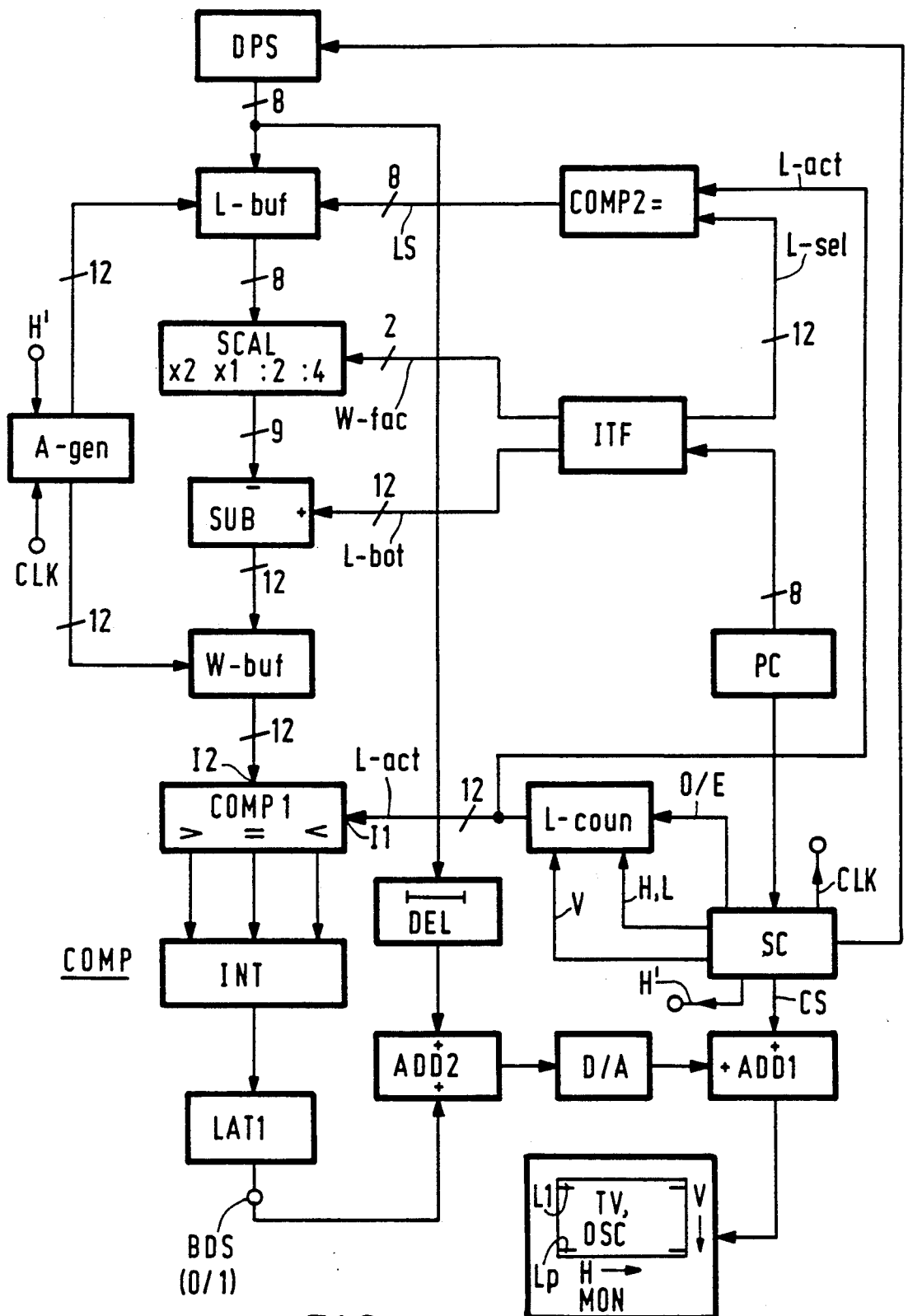
FIG. 1 is a block schematic diagram of an embodiment of a picture display device according to the invention.

FIG. 1 shows a digital picture signal source DPS supplying picture information to be displayed on a display screen denoted by (TV, OSC) of a display device MON. The reference TV indicates that the device MON is a television display device in its broadest sense. The device MON ensures a display on the screen (TV, OSC) of a picture formed in a line and field-sequential manner. Lines L of pixels are denoted by a first line L1 and a last line Lp, the reference p designating the number of picture lines for the display. The lines L may be present in an interlaced or non-interlaced picture, with two or more fields forming a frame in the case of an interlaced picture. In the case of a non-interlaced picture a field period is equal to a frame period in which the lines are consecutively written on the screen (TV, OSC) in line periods. The reference H denotes the line scan direction, i.e. the horizontal direction in the device MON, while the field or frame scan direction is denoted by the vertical direction symbol V. In the description of FIG. 1 the reference V further denotes a field-synchronizing signal or a field reset signal and H or (H, L) may denote a line-synchronizing signal. In this case the screen (TV, OSC) may show a stationary or moving picture, dependent on the form of the source DPS. The source DPS is assumed to be a digital signal source which supplies picture information for stationary and/or moving pictures. Source DPS may be a digital memory, a television camera which is followed by an A/D converter, or it may comprise a television storage and display device in the form of a tape and disc, etc.

It is assumed that the picture display device according to FIG. 1 comprises a personal computer device PC controlling the picture display device. The example shown in the Figure is that of the device PC coupled to a synchronizing circuit SC via which the source DPS is controlled. A direct control would also be possible. The circuit SC supplies, for example, the signals V and (H, L), a line frequency reset and enable signal H', a clock pulse signal CLK, a field and line-synchronizing and blanking signal CS composed or not composed in accordance with a standard, and an odd/even field signal O/E in the case of 2:1 interlacing. The signal O/E provides an odd and an even line enumeration for the interlaced fields with a logic 0 and 1 by way of an addition with line numbers. The signal CS, which is shown by way of example, is applied to a (+) input of an adder circuit ADD1, an output of which is coupled to a picture display input of the device MON. An output of the digital picture signal source DPS is coupled to another input of the adder circuit ADD1 via a series arrangement of a delay circuit DEL, an adder circuit ADD2 and a D/A converter D/A. A (+) input of the circuit ADD2 is coupled to an output BDS of a part of the picture display device in which the invention is embodied. In fact, the output BDS supplies a brightness drive signal which occurs as a binary signal (0/1) and which is also denoted by BDS. For example, the logic 1 leads to a drive of the device MON in which very bright or black pixels occur, as desired, in the picture on the screen (TV, OSC). This makes the device MON suitable for displaying oscilloscopic images in the form of waveform profiles. For the sake of completeness it is to be noted that the delay circuit DEL is used for compensating delays which occur when generating the signal BDS. The circuit DEL may be present in the source DPS itself. If the source DPS not only supplies the picture information but also the information contained in the signal CS, the converter D/A may be directly connected to the device MON. If the source DPS is formed as a memory, the memory is not optimally utilized because, unlike the changeable or changing picture information, the synchronizing information is fixed so that it need not be stored. When using the device MON for the oscilloscopic image of the waveform profile only, the output BDS is directly connected to the display input of the device MON.

According to FIG. 1 a series arrangement of a line buffer circuit L-buf, a multiplier or divider circuit SCAL, a subtractor circuit SUB, a further line buffer circuit W-buf, a signal comparator COMP1, an interpolation circuit INT and a latch circuit LAT1 is arranged between parallel outputs (8) of the source DPS and the single output BDS for digitally generating the binary drive signal BDS. The circuits COMP1, INT and LAT1 are jointly indicated by a signal comparison circuit COMP. Furthermore, FIG. 1 shows an address generator A-gen, outputs of which are connected to the circuits L-buf and W-buf and outputs of which receive the signals H' and CLK. A line counting circuit L-coun receives the signals V, (H, L) and O/E and applies an actual line number L-act to inputs I1 of the signal comparator COMP1 and to inputs of a further signal comparator COMP2=. The device PC is coupled via an interface circuit ITF to inputs (+) of the circuit SUB for applying a selectable line number L-bot, to inputs of the circuit SCAL for applying selectable factors W-fac equal to x2, x1, :2 and :4, and to inputs of the circuit COMP2= for applying a selectable line number L-sel. Outputs of the circuit COMP2= are connected to inputs of the line buffer circuit L-buf for applying a write signal LS associated with the selectable line number L-sel.

The description of the generation of the signal BDS starts from a given television standard which is taken as an example. A standard of 625 lines, 50 Hz field frequency and 2:1 interlacing is assumed. Associated with this standard is a line period of 64 μs which has a line blanking period of 12 μs and a line scan period or picture information period of 52 μs. A field blanking of 8% leads to a field-blanking period of 25 line periods so that 287.5 lines are available per field and 575 lines are available per frame for display. In this case it holds that the picture line number p for the display is equal to 575, while the lines L in the two fields displayed are enumerated in the sequence L1, L3, L5 ... L575 and L2, L4, L6 ... L574. The clock pulse signal CLK for signal sampling is assumed to be used for the A/D conversion at a clock pulse frequency of 13.5 MHz. As a result, there is a pixel period of 74.1 ns and 702 pixels occur in the period of 52 μs.

FIG. 1 shows that an 8-bit wide bus is present between the source DPS and the line buffer circuit L-buf. The picture information may thus have 256 digital values. In each 74 ns a pixel value becomes available for the circuit L-buf. At the instant when the changing, actual line number L-act is equal to the selected line number L-sel, i.e. L-act=L-sel, the circuit COMP2= applies the write signal LS to the circuit L-buf so that this circuit picks up the picture information (being one of the 256 possible values) in 702 buffer elements under control of the address generator A-gen with a maximum count of 702. In this case it is assumed that the count is effected from the start of the lines L to be displayed on the screen (TV, OSC), with the H' signal as a reset and enable signal. Pick-up is effected once during each frame period of 40 ms. The line whose picture information will be displayed as a waveform profile is selected via the selectable line number L-sel. It is assumed that the information originating from the circuit L-buf is processed by the circuits SCAL and SUB and that the processed information is stored in the circuit W-buf in the field-blanking period between odd and even fields, during 62 μs. Thus, during each frame period of 40 ms, after a reset, the information is refreshed in the circuit W-buf. Picture information changes occurring in the same selected line occur in steps of 40 ms in the waveform to be displayed. Another choice for the selected line is effected during a frame period, and after a reset by the field reset signal the contents of the circuit L-buf are adapted in the next frame period, which contents reach the circuit W-buf in a processed form in the subsequent frame period. The displayed information is then adapted in steps of 80 ms at a maximum. The transition steps do not lead to visible perturbations on the screen (TV, OSC).

The first part of the signal processing operation implies a multiplication or division by a selectable multiplication factor equal to 2 or 1 or a dividing factor equal to 2 or 4. For this choice there is a 2-bit wide bus which provides the four factors W-fac. The 256 possible digital signal values originating from the circuit L-buf can thereby be increased to 512, remain 256 or be reduced to 128 or 64 possible digital signal values. This means that the waveform profile can be displayed on the screen (TV, OSC) over a height of 512, 256, 128 or 64 picture lines. The 512 picture line height implies a strip across substantially the entire screen height of 575 picture lines, with the other three picture line heights being narrower strips of substantially half, one fourth or one eighth part thereof. This makes it possible to bring the digital signal values to scale in four possible areas, that is to say, a waveform profile selected via the line number L-sel can be displayed in four strips with the height ratios 1:2:4:8 by choosing W-fac to be equal to :4, :2, x1 and x2, respectively.

The location of the strip on the display screen (TV, OSC) is determined by the subtractor circuit SUB. The information brought to scale in the circuit SCAL is applied via a 9-bit wide bus to (−) inputs of the subtractor circuit SUB. The selectable line number L-bot is presented via a 12-bit wide bus to (+) inputs of the circuit SUB and the lower or bottom line of the display strip is selected by means of this line number. To elucidate the explanation, the choice of W-fac=:2 will be given as an example so that an oscilloscopic display strip of 128 picture lines is present. In the case of the bottom line choice L-bot=L575 or L-bot=L128 there is a display strip with the lines L448 up to and including L575 and L1 up to and including L128, respectively, because 127 lines must be subtracted. The result is a display strip with 128 lines at the bottom and at the top, respectively, of the display screen (TV, OSC).

The subtract circuit SUB passes on the difference result for storage to the circuit W-buf, which thus contains the waveform profile to be displayed oscilloscopically. Via a 12-bit wide bus the waveform information to be displayed is passed on to inputs I2 of the signal comparator COMP1, to whose inputs I1 the actual line number L-act is applied. In the comparator COMP1 the digital waveform values stored in the 702 buffer elements of the circuit W-buf are successively compared with the actual line number L-act. FIG. 1 shows that the signal comparator COMP1 is of the type having three outputs for supplying a comparison result with the respective functions of larger than (>), equal to (=) and smaller than (<). These comparison results, in the form of, for example, a logic 1 at the relevant output, are applied to the interpolation circuit INT which is operative in a manner to be described with reference to FIGS. 2 and 3 for obtaining a more or less continuous profile in the case of a waveform display. Per pixel, the circuit INT supplies a logic 0 or 1 which is retained each pixel period in the latch circuit LAT1 and is thus present in the binary drive signal at the output BDS.

FIG. 1 is shown for the case where the picture lines L are enumerated in an ascending sequence from L1 to Lp=L575 from top to bottom, indicated in the vertical direction V at the display screen (TV, OSC). The use of the subtractor circuit SUB with the (−) inputs connected to the circuit SCAL is associated therewith. In fact, reckoned from the bottom line with line number L-bot, the selected number of strip lines minus one must be subtracted so as to obtain the line number of the upper line of the strip. If, instead of an ascending picture line enumeration in the V direction at the screen (TV, OSC), a descending line enumeration is used, the subtractor circuit SUB must be replaced by an adder circuit ADD because the top line of the strip then has a higher line number than the bottom line.

The selected line number L-bot which determines the bottom line of the strip and the selected factor W-fac, which determines the height of the strip, may cause the difference result at the subtractor circuit SUB to become negative. This means that the selected potential strip height is reduced because the upper part of the strip disappears, as it were, behind the upper edge of the screen. To prevent this possibility from frequently occurring in an undesirable manner when selecting W-fac=(x2) at the circuit SCAL, the product of the number of possible digital values in the buffer elements of the circuit L-buf, namely 256, and the largest multiplication factor of 2 should be smaller than or equal to the picture line number p=575. At the selected values there is a difference of 575−512=63 picture lines, so that the line number L-bot can be chosen between L575 and L512. However, the problem only occurs when the waveform profile to be displayed continues as far as the top line of the strip because the maximum value of 256 is then present in a buffer element of the circuit L-buf.

By forming the circuit SCAL with factors which are selectable from a group of integral powers of the factor 2, they can be obtained in a simple, binary manner. Starting from a bit word at the input of the circuit SCAL with the most signficant bit (MSB) at the left and the bit value descending (MSB-1, MSB-2) to the right until the least significant bit (LSB), W-fac=(x2) implies a one-position shift to the left, at LSB=0;
W-fac=(x1) implies MSB=0;
W-fac=(:2) implies a one-position shift to the right, wit MSB=MSB−1=0; and
W-fac=(:4) implies a two-position shift to the right, wit MSB=MSB−1=MSB−2=0.

Associated with the described factor x2 is the widening of the bus from 8 bits to 9 bits at the circuit SCAL.

For an unchanged picture line number p=575 the factors x4, x2, x1, :2, :4, :8, etc. may be selectable if the circuit SCAL is connected to a 7-bit wide bus, in which 128 possible values can be supplied from the circuit L-buf.

The picture display device of FIG. 1 is suitable for obtaining one waveform profile on the screen (TV, OSC). An extension to the simultaneous display of a number of two or more waveform profiles can be easily realised by choosing the same number of subsequent circuits: L-buf, W-buf, COMP1, INT and LAT1, with the circuits SCAL and SUB remaining single and being common to the system and the output BDS being the output of an OR gate. The address generator A-gen, the line counting circuit L-coun and the interface circuit ITF are also common. Each individual circuit L-buf may be coupled to its own signal comparator COMP2= or there may be a common signal comparator in which, for example, all selected line numbers L-sel are applied to the signal comparator and each circuit L-buf is enabled by its own number L-sel. The multiple waveform display can easily be realised via a control program provided by the device PC.

Figure 2:
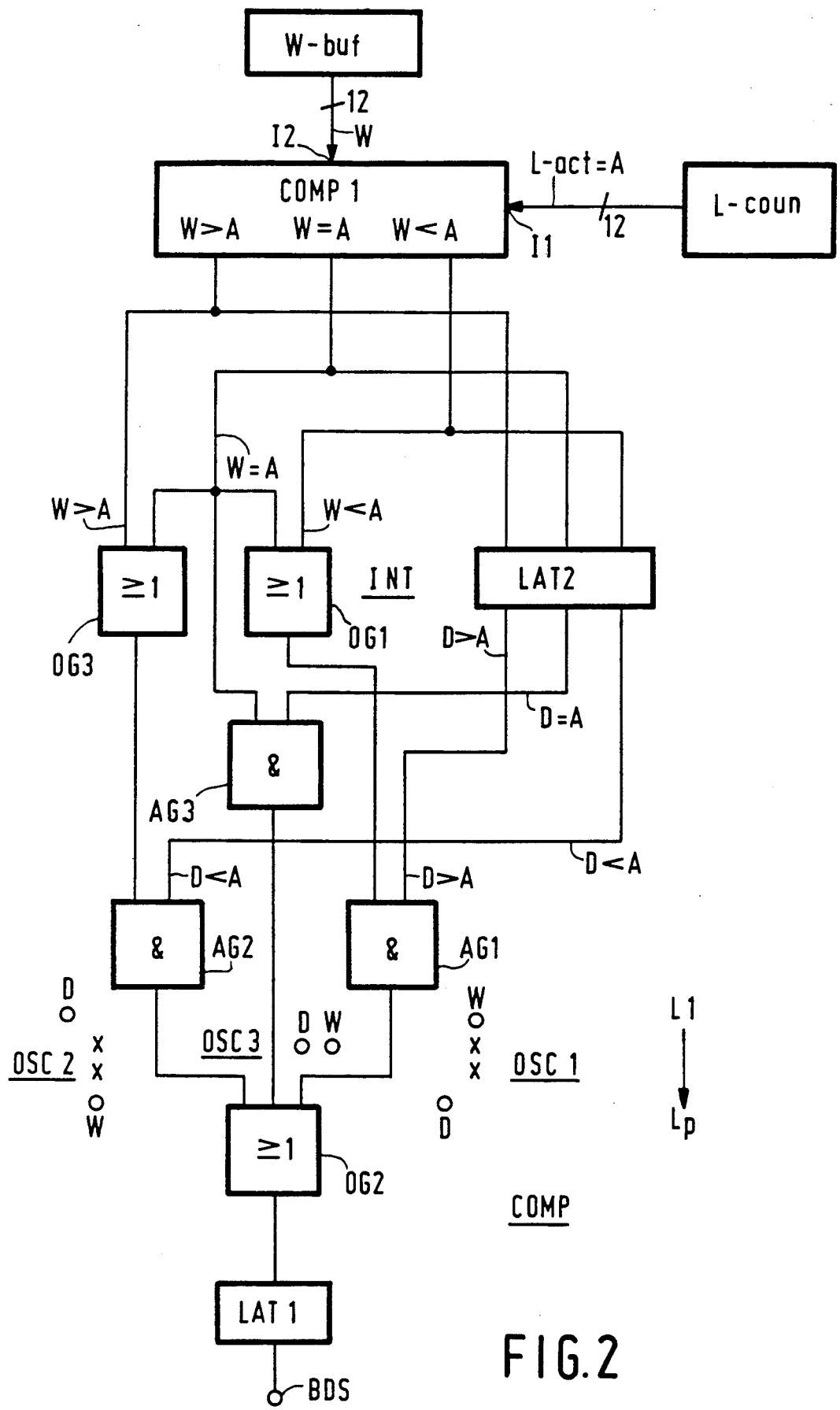
FIG. 2 is a block schematic diagram of a first embodiment of a signal comparison circuit comprising an interpolation circuit for use in a device according to the invention.

FIG. 2 is a block-schematic diagram of a possible embodiment of the interpolation circuit INT in the signal comparison circuit COMP of FIG. 1. The reference L-act=A is denoted at the line counting circuit L-coun which supplies the actual line number L-act. For the line buffer circuit W-buf, which supplies the digital values from 702 buffer elements for the waveform to be displayed oscilloscopically, it holds that these are applied as values W to the inputs I2. At the signal comparator COMP1 the references W>A, W=A and W<A are denoted at the outputs, with a logic 1 and 0 at the output implying true or not true.

To eluchidate the manner of interpolation between two consecutive pixels detected for the waveform to be filled with intermediate, undetected pixels, two images OSC1 and OSC2 are shown in FIG. 2. The circles denote detected 0 pixels and crosses denote undetected x pixels which must be filled as connection pixels for obtaining the continuous profile. An image OSC3 shows two adjacent detected 0 pixels. At the images OSC1, OSC2 and OSC 3 the instantaneous pixel is denoted by W and the previous, preceding pixel is denoted by D. The reference L1→Lp denotes the ascending line numbers.

Image OSC1 shows that a profile filling at the x pixels is required if the relation W<A<D holds. Image OSC2 shows that a profile filling at the x pixels is required if the relation D<A<W holds. The relation D=A=W is associated with OSC3 with which the detected drive without interpolation is associated. For all three relations the drive should be (BDS=1) so that the requirement BDS=1 is imposed if the function holds that:

$$(W<A<D)+(D>A>W)+(D=A=W) \quad (1)$$

FIG. 2 shows a realisation of the interpolation circuit INT if it comprises integrated circuits operating in accordance with transistor-transistor logics, with which the following logic function is associated:

$$[[[W<A]+[W=A]].[D>A]]+[[[W>A]+[W=A]].-[D<A]]+[[W=A].[D=A]]. \quad (2)$$

In FIG. 2 a latch circuit LAT2 supplies the information D>A, D=A and D<A. An OR gate OG1 performs the operation [W<A]+[W=A].[[W<A]+[-W=A]].[D>A]] is subsequently obtained via an AND gate AG1, which is passed on to the latch circuit LAT1 via an OR gate OG2. The first term of the function (2) is thus obtained. In the same way the second term is obtained via the OR gate OG2 by means of an OR gate OG3 and an AND gate AG2. The third term is obtained by means of an AND gate AG3 which performs the operation [W=A].[D=A] The interpolation is realised in the manner described by means of only one latch circuit LAT2 and three OR gates OG and AND gates AG.

Figure 3:
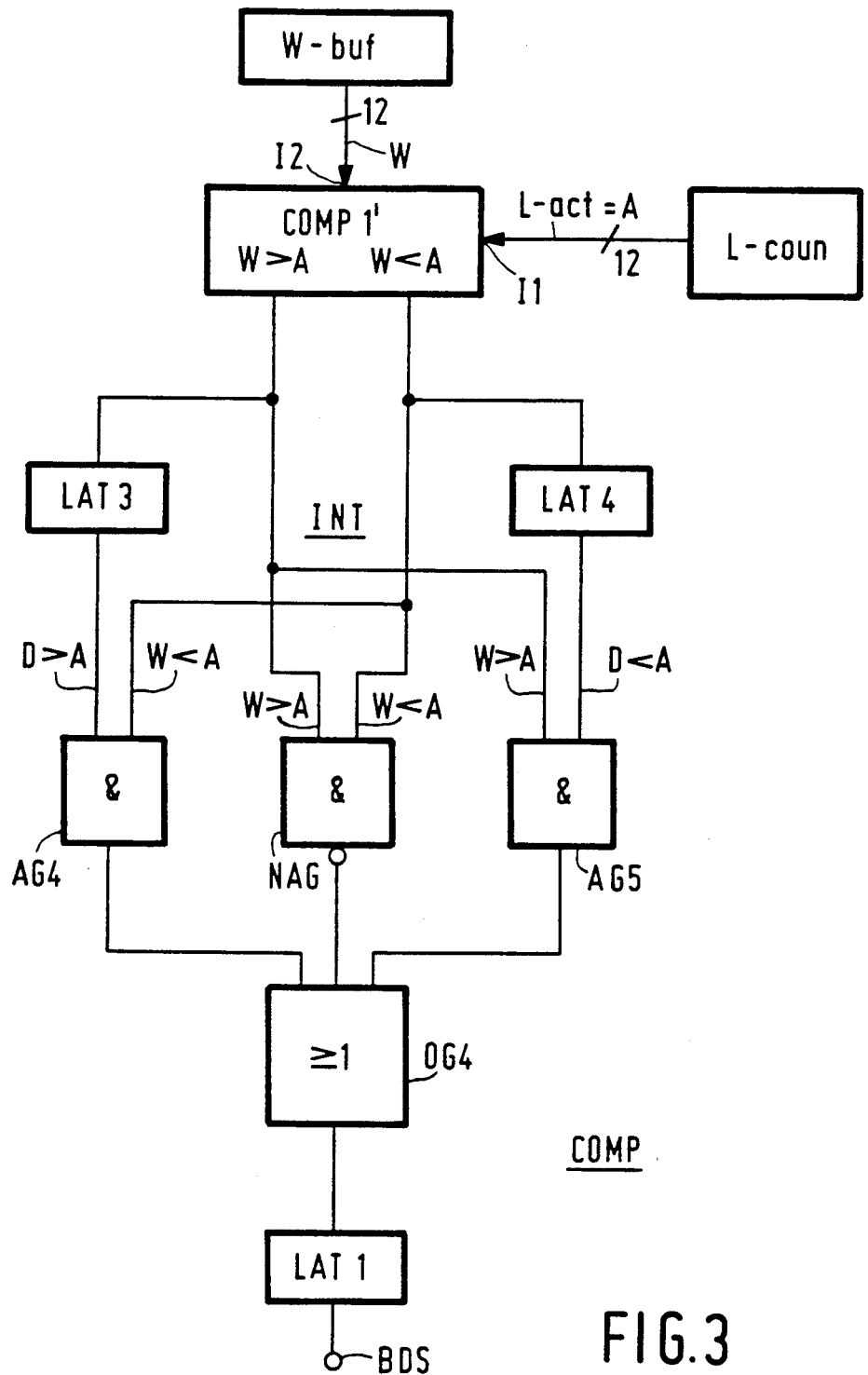
FIG. 3 shows a second embodiment.

FIG. 3 shows an embodiment of the interpolation circuit INT if use is made of a programmable array logics device (PAL) with the advantage of a lower delay time. In this case no use is made of the information W=A and it is also superfluous because the relation holds:

$$[W=A]=[[W>A].[W<A]] \quad (3)$$

i.e. 2 logic 0s at the inputs of a NAND gate yield one logic 1 at its output. The function (2) remains valid and can be adapted to the array logics by introducing the function (3) with [W=A] and [D=A] therein. According to the relevant array logics rules it can be derived therefrom that the following function must be satisfied:

$$[[W<A].[D>A]]+[[W>A].[D<A]]+[-[W<A].[W>A]] \quad (4)$$

FIG. 3 diagrammatically shows the function (4). The signal comparator denoted by COMP1' is of the type having two outputs, W>A and W<A. The respective information D>A and D<A is obtained via two latch circuits LAT3 and LAT4. The first part of the function (4) is obtained via and AND gate AG4 whose output is connected to the latch circuit LAT1 via an OR gate OG4. In the same way the second part of the function (4) is obtained via an AND gate AG5. The third part is supplied by a NAND gate NAG.

It is apparent from the foregoing that the picture display device of FIG. 1 not only has an inherently more accurate positioning capability due to the fact that the signals are processed digitally, but also provides the possibility of displaying a waveform profile which, as desired, is movable and can be observed on a different scale and which approaches an optimum continuous variation.

We claim:

1. In a picture display device for displaying an oscilloscopic image on a display screen on which a picture is formed line and field-sequentially, in which the picture is composed of pixels in a given number of picture lines and a location-dependent, determined brightness drive of pixels during line periods and field or frame periods covering said line periods results in the oscilloscopic image, the improvement comprising: a signal comparison circuit having a first input means for receiving a signal which determines the location during a field or frame period, a second input means for receiving a signal occurring at the line frequency and having a waveform profile to be displayed, and an output supplying a brightness drive signal, characterized in that the lines in the frame scan direction are enumerated in an ascending or descending sequence with respect to said picture line number in the picture display device which operates on a digital basis, a line buffer circuit which stores the signal to be displayed as digital values after a write signal associated with a selected line having a selectable first line number is applied to said line buffer circuit, outputs of the line buffer circuit supplying a digital display signal to inputs of a scaling circuit operating with selectable multiplication or dividing factors, outputs of the scaling circuit being coupled to inputs of a level shift circuit having other inputs which receive a selectable second line number for addition, means coupling outputs of the level shift circuit to inputs of a further line buffer circuit for storing the waveform profile to be displayed as a difference or sum result, and means coupling outputs of said further line buffer circuit to the second input means of said signal comparison circuit, first inputs of which are coupled to outputs of a line counting circuit for counting the lines of the line numbers ascending or descending in the frame scan direction, which outputs thereby convey an actual line number.

2. A picture display device as claimed in claim 1, wherein the product of the number of possible digital values of digital display signal and the largest multiplication factor of the selectable factors is less than or equal to said picture line number.

3. A picture display device as claimed in claim 2, wherein the factors are selectable from a group of integral powers of the factor 2.

4. A picture display device as claimed in claim 1, wherein the signal comparison circuit comprises a signal comparator having three outputs for supplying a comparison result with the respective functions of $W>A$, $W=A$ and $W<A$, where the digital value W is the instantaneous value which is supplied by the further line buffer circuit and the digital value A is the actual line number originating from the line counting circuit, said three outputs being coupled to inputs of an interpolation circuit, and means coupling an output of the interpolation circuit to the output of the signal comparison circuit.

5. A picture display device as claimed in claim 4, wherein the interpolation circuit comprises integrated circuits operating in accordance with transistor-transistor logics, the interpolation for generating the brightness drive signal being effected in accordance with the following logic function:

$[[[W<A]+[W=A]].[D>A]]+[[[W>A]+[W=A]].[D<A]]+[[W=A].[D=A]]$, where D is the digital value of the previous value preceding the value W.

6. A picture display device as claimed in claim 1, wherein the signal comparison circuit comprises a signal comparator of the type having two outputs for supplying a comparison result with the respective functions of larger than and smaller than, said two outputs being coupled to inputs of an interpolation circuit, and means coupling an output of the interpolation circuit to the output of the signal comparison circuit, and wherein the interpolation circuit comprises a programmable series logics device.

7. A picture display device as claimed in claim 6, wherein the interpolation for generating the brightness drive signal is effected in accordance with the following logic function:

$[[W<A].[D>A]]+[[W>A].[D<A]]+[[W<A].[W>A]]$, in which the digital value W is the instantaneous value which is supplied by the further line buffer circuit, the digital value D is equal to the previous value preceding the value W and the digital value A is the actual line number originating from the line counting circuit.

8. A picture display device as claimed in claim 1, wherein the factors are selectable from a group of integral powers of the factor 2.

9. A picture display device as claimed in claim 8, wherein the signal comparison circuit comprises a signal comparator having three outputs for supplying a comparison result with the respective functions of larger than, equal to and smaller than, said three outputs being coupled to inputs of an interpolation circuit including logic circuits, and means coupling an output of the interpolation circuit to the output of the signal comparison circuit.

10. A picture display device as claimed in claim 2, wherein the signal comparison circuit comprises a signal comparator having three outputs for supplying a comparison result with the respective functions of larger than, equal to and smaller than, said three outputs being coupled to inputs of an interpolation circuit including logic circuits, and means coupling an output of the interpolation circuit to the output of the signal comparison circuit.

11. A picture display device as claimed in claim 10, wherein the interpolation circuit comprises integrated circuits operating in accordance with transistor-transistor logic, the interpolation for generating the brightness drive signal being effected in accordance with the following logic function: $[[[W<A]+[W=A]].[D>A]]+[[[W>A]+[W=A]].[D<A]]+[[W=A].[D=A]]$, in which the digital value W is the instantaneous value which is supplied by the further line buffer circuit, the digital value D is equal to the previous value preceding the value W and the digital value A is the actual line number originating from the line counting circuit.

12. A picture display device as claimed in claim 2, wherein the signal comparison circuit comprises a signal comparator of the type having two outputs for supplying a comparison result with the respective functions of larger than and smaller than, said two outputs being coupled to inputs of an interpolation circuit including logic circuits, and means coupling an output of the interpolation circuit to the output of the signal comparison circuit, and wherein the interpolation circuit comprises a programmable series logic device.

13. A picture display device as claimed in claim 8, wherein the signal comparison circuit comprises a signal comparator of the type having two outputs for supplying a comparison result with the respective functions of larger than and smaller than, said two outputs being coupled to inputs of an interpolation circuit including logic circuits, and means coupling an output of the interpolation circuit to the output of the signal comparison circuit, and wherein the interpolation circuit comprises a programmable series logic device.

14. A picture display device as claimed in claim 13, wherein the interpolation for generating the brightness drive signal is effected in accordance with the following logic function: $[[W<A].[D>A]]+[[W>A].[D<A]]+[[W<A].[W>A]]$, in which the digital value W is the instantaneous value which is supplied by the further line buffer circuit, the digital value D is equal to the previous value preceding the value W and the digital value A is the actual line number originating from the line counting circuit.

15. In a raster scan picture display device of the type including means for producing a visible spot on a display screen, means for varying the light intensity of the spot, and means for scanning the spot over the display screen in a rectangular raster scan pattern comprising a given number of parallel rectilenear picture lines, the improvement comprising a digital apparatus for deriving a digital type brightness drive signal for said light intensity varying means and wherein the image height and image location on the display screen can be varied, said digital apparatus comprising:
    a first line storage device for storing digital signals of the picture information to be displayed under control of a write signal determined by a selected picture line having a selectable first line number, said first line storage device having output means for supplying a digital display signal,
    a scaling circuit having first input means coupled to said output means of the first line storage device and second input means for receiving selectable scaling factors which control the number of picture lines that make up the image height,
    a level shift circuit having first input means coupled to output means of the scaling circuit and second input means which receive a selectable second line number which determines the location of the bottom picture line of a display image on the display screen,
    a second line storage device coupled to output means of the level shift circuit thereby to store signals of the image to be displayed,
    a signal comparison circuit having first input means coupled to output means of the second line storage device, second input means coupled to output means of a line counting circuit that provides actual line numbers, and an output at which a digital-type brightness drive signal is produced for said picture display device.

16. A picture display device as claimed in claim 15, wherein the signal comparison circuit comprises:
    a signal comparator which includes said first and second input means of the signal comparison circuit and output means that supply the signals $W>A$, $W=A$ and $W<A$, where W is a present digital value supplied by the second line storage device and A is a digital value of the actual line number received from the line counting circuit, and
    an interpolation circuit including logic circuits and having input means coupled to the output means of the signal comparator and output means coupled to said output of the signal comparison circuit.

17. A picture display device as claimed in claim 16, wherein said logic circuits derive the following logic function: $[[[W<A]+[W=A]].[D>A]]+[[[W>A]+[W=A]].[D<A]]+[[W=A].[D=A]]$, where D is a digital value corresponding to a previous value preceding the value W.

18. A picture display device as claimed in claim 15, wherein the signal comparison circuit comprises:
    a signal comparator which includes said first and second input means of the signal comparison circuit and output means that supply the signals $W>A$ and $W<A$, where W is a present digital value supplied by the second line storage device and A is a digital value of the actual line number received from the line counting circuit, and
    an interpolation circuit including logic circuits and having input means coupled to the output means of the signal comparator and output means coupled to said output of the signal comparison circuit.

19. A picture display device as claimed in claim 18, wherein said logic circuits derive the following logic function: $[[W<A].[D>A]]+[[W>A].[D<A]]+[[W<A].[W>A]]$, where D is a digital value corresponding to a previous value preceding the value W.

20. A picture display device as claimed in claim 15 which further comprises:
    delay means which receive said digital signals of the picture information to be displayed, and
    adder means having a first input coupled to an output of the delay means, a second input coupled to said output of the signal comparison circuit, and an output coupled to a control input of a TV oscilloscope of the picture display device.

* * * * *